United States Patent
Lee et al.

(10) Patent No.: US 7,196,000 B2
(45) Date of Patent: Mar. 27, 2007

(54) METHOD FOR MANUFACTURING A WAFER LEVEL CHIP SCALE PACKAGE

(75) Inventors: Jin-Hyuk Lee, Kyungki-Do (KR);
Gu-Sung Kim, Kyungki-do (KR);
Dong-Ho Lee, Kyungki-do (KR);
Dong-Hyeon Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 51 days.

(21) Appl. No.: 10/690,782

(22) Filed: Oct. 21, 2003

(65) Prior Publication Data

US 2004/0082106 A1    Apr. 29, 2004

(30) Foreign Application Priority Data

Oct. 22, 2002    (KR)    ............. 10-2002-0064513

(51) Int. Cl.
*H01L 21/44* (2006.01)

(52) U.S. Cl. .............. 438/612; 438/652; 438/653; 438/665

(58) Field of Classification Search ........... 438/612, 438/FOR. 363, 964; 257/774, 739, 964
See application file for complete search history.

(56) References Cited

U.S. PATENT DOCUMENTS

| | | | | |
|---|---|---|---|---|
| 4,723,197 A | * | 2/1988 | Takiar et al. ............. | 361/771 |
| 5,124,781 A | * | 6/1992 | Tashiro ...................... | 257/759 |
| 5,248,903 A | * | 9/1993 | Heim ........................ | 257/748 |
| 5,284,797 A | * | 2/1994 | Heim ........................ | 438/612 |
| 5,357,136 A | * | 10/1994 | Yoshioka ................... | 257/383 |
| 5,394,013 A | * | 2/1995 | Oku et al. .................. | 257/786 |
| 5,502,337 A | * | 3/1996 | Nozaki ...................... | 257/773 |
| 5,621,246 A | * | 4/1997 | Motoyama ................. | 257/736 |
| 5,700,735 A | * | 12/1997 | Shiue et al. ................ | 438/612 |
| 5,723,822 A | * | 3/1998 | Lien .......................... | 174/250 |

(Continued)

FOREIGN PATENT DOCUMENTS

JP    04348047 A    * 12/1992

(Continued)

OTHER PUBLICATIONS

English language of Korean Abstract for Korean Patent Publication No. 2001-04529, filed Jan. 15, 2001.

(Continued)

*Primary Examiner*—David E. Graybill
(74) *Attorney, Agent, or Firm*—Marger Johnson & McCollom, P.C.

(57) ABSTRACT

A semiconductor wafer with semiconductor chips having chip pads and a passivation layer is provided. First and second dielectric layers are sequentially formed on the passivation layer. The first and second dielectric layers form a ball pad area that includes an embossed portion, i.e., having a non-planar surface. A metal wiring layer is formed on the resulting structure including the embossed portion. A third dielectric layer is formed on the metal wiring layer. A portion of the third dielectric layer located on the embossed portion is removed to form a ball pad. A solder ball is formed on the embossed ball pad. With the embossed ball pad, the contact area between the solder balls and the metal wiring layer is increased, thereby improving the connection reliability.

12 Claims, 10 Drawing Sheets

U.S. PATENT DOCUMENTS

| | | | |
|---|---|---|---|
| 5,736,791 A * | 4/1998 | Fujiki et al. | 257/781 |
| 5,773,899 A * | 6/1998 | Zambrano | 257/784 |
| 5,889,655 A * | 3/1999 | Barrow | 361/760 |
| 5,986,343 A * | 11/1999 | Chittipeddi et al. | 257/758 |
| 6,022,792 A * | 2/2000 | Ishii et al. | 438/462 |
| 6,040,604 A * | 3/2000 | Lauvray et al. | 257/355 |
| 6,093,630 A * | 7/2000 | Geffken et al. | 438/612 |
| 6,150,725 A * | 11/2000 | Misawa et al. | 257/781 |
| 6,181,016 B1 * | 1/2001 | Lin et al. | 257/786 |
| 6,191,023 B1 * | 2/2001 | Chen | 438/612 |
| 6,207,547 B1 * | 3/2001 | Chittipeddi et al. | 438/612 |
| 6,232,147 B1 * | 5/2001 | Matsuki et al. | 438/108 |
| 6,300,688 B1 * | 10/2001 | Wong | 257/786 |
| 6,306,750 B1 * | 10/2001 | Huang et al. | 438/612 |
| 6,313,537 B1 * | 11/2001 | Lee et al. | 257/758 |
| 6,444,295 B1 * | 9/2002 | Peng et al. | 428/209 |
| 6,492,683 B2 * | 12/2002 | Kobayashi | 257/347 |
| 6,500,748 B2 * | 12/2002 | Anand | 438/612 |
| 6,511,901 B1 * | 1/2003 | Lam et al. | 438/612 |
| 6,531,384 B1 * | 3/2003 | Kobayashi et al. | 438/612 |
| 6,551,916 B2 * | 4/2003 | Lin et al. | 438/612 |
| 6,563,216 B1 * | 5/2003 | Kimura et al. | 257/737 |
| 6,573,170 B2 * | 6/2003 | Aoyagi et al. | 438/612 |
| 6,577,017 B1 * | 6/2003 | Wong | 257/786 |
| 6,625,882 B1 * | 9/2003 | Saran et al. | 29/843 |
| 6,717,238 B2 * | 4/2004 | Ker et al. | 257/602 |
| 6,717,243 B2 * | 4/2004 | Shinogi et al. | 257/673 |
| 6,756,671 B2 * | 6/2004 | Lee et al. | 257/737 |
| 6,780,748 B2 * | 8/2004 | Yamaguchi et al. | 438/612 |
| 6,803,302 B2 * | 10/2004 | Pozder et al. | 438/612 |
| 6,825,541 B2 * | 11/2004 | Huang et al. | 257/459 |
| 2001/0009802 A1 * | 7/2001 | Lee | 438/612 |
| 2001/0051426 A1 * | 12/2001 | Pozder et al. | 438/666 |
| 2002/0068385 A1 * | 6/2002 | Ma et al. | 438/118 |
| 2002/0076913 A1 * | 6/2002 | Lee | 438/614 |
| 2002/0195269 A1 * | 12/2002 | Pearson et al. | 174/260 |
| 2003/0134496 A1 * | 7/2003 | Lee et al. | 438/612 |
| 2003/0234447 A1 * | 12/2003 | Yunus et al. | 257/739 |
| 2004/0004284 A1 * | 1/2004 | Lee et al. | 257/737 |

FOREIGN PATENT DOCUMENTS

| | | |
|---|---|---|
| JP | 2000-286283 | 10/2000 |
| KR | 2000-65487 | 11/2000 |
| KR | 2001-04529 | 1/2001 |

OTHER PUBLICATIONS

English language of Korean Abstract for Korean Patent Publication No. 2000-65487, filed Nov. 15, 2000.

English language of Japanese Abstract for Japanese Patent Publication No. 2000-286283, filed Oct. 13, 2000.

* cited by examiner

METHOD FOR MANUFACTURING A WAFER LEVEL CHIP SCALE PACKAGE

The present application claims priority from Korean Patent Application No. 2002-64513 filed Oct. 22, 2002, the contents of which are incorporated herein by reference in their entirety.

BACKGROUND OF THE INVENTION

1. Field of the Invention

The present invention relates to a method for manufacturing a wafer level chip scale package.

2. Description of the Related Art

Lately, the electronic industry has been seeking to manufacture electronic products that are extremely small, light weight, operate at high speeds, have multiple functions and have high performance, all at an effective cost. One of the methods used to try to attain such a goal is a package assembly technique. Thanks to this technique, new types of packages have been developed, for example, a chip scale or chip size package (CSP). The CSP has a number of advantages over typical plastic packages. Of all the advantages, the most important is the package size. According to international semiconductor associations, such as the Joint Electron Device Engineering Council (JEDEC), and Electronic Industry Association of Japan (EIAJ), the CSP is defined as a package whose size is not larger than 1.2 times the size of the chip.

The CSP has been mainly employed in electronic products requiring miniaturization and mobility, such as digital camcorders, portable telephones, notebooks, and memory cards. CSPs include semiconductor devices such as digital signal processors (DSP), application specific integrated circuits (ASIC), and micro controllers. CSPs also include memory devices such as dynamic random access memories (DRAM) and flash memories. Use of CSPs having memory devices is steadily increasing. Over fifty varieties of CSPs are at present being developed or produced all over the world.

The CSP has, however, some drawbacks. For example, there are some difficulties in obtaining acceptable reliability of the package. Further, the CSP needs additional equipment requiring large quantities of raw and/or subsidiary materials and high per unit costs of production, which causes a reduction in price competition.

In order to overcome these drawbacks, a wafer level chip scale package (WLCSP) has appeared as a solution.

Generally, a package is manufactured through wafer fabrication, cutting, and assembly processes. The package assembly process employs separate equipment and raw/subsidiary materials from those of the wafer fabrication process. The WLCSP, however, can allow manufacture of the packages as final products at wafer level, i.e. without dividing them into individual chips. The WLCSP can apply the equipment and processes used for the wafer fabrication process to complete the package assembly process as well. Therefore, the WLCSP may allow the manufacture of packages at a more effective cost.

FIG. 1 is a plan view of a conventional WLCSP 20. FIG. 2 is a cross-sectional view taken along the line 2—2 in FIG. 1. Solder balls (28 of FIG. 2) are not illustrated in FIG. 1 to illustrate a ball pad 23.

Referring to FIGS. 1 and 2, a CSP 20 comprises a semiconductor chip 14. The semiconductor chip 14 has a plurality of chip pads 11. The chip pads 11 are disposed at the periphery of an upper surface of a silicon substrate 12. A metal wiring layer 21 is formed for redistribution of the chip pad 11. The solder balls 28 are formed on ball pads 23 located at the ends of the metal wiring layer 21.

The semiconductor chip 14 comprises the chip pads 11 and a passivation layer 13. The chip pads 11 are electrically connected to an integrated circuit (IC) of the silicon substrate 12. The passivation layer 13 protects the IC and the chip pads 11. The chip pads 11 are made of Al and the passivation layer 13 is made of oxide film or nitride film.

A dielectric layer 22 (hereinafter referred to as a first dielectric layer) is formed on the passivation layer 13 at a predetermined thickness, and is used for formation of the metal wiring layer 21. The first dielectric layer 22 overlies the passivation layer 13, leaving a portion of each chip pad 11 exposed.

A metal base layer 25 is formed on the chip pad 11 and the first dielectric layer 22, in the position on which the metal wiring layer 21 is to be formed.

The metal wiring layer 21 is formed on the first dielectric layer 22 toward the center of the silicon substrate 12. The metal wiring layer 21 is connected to the chip pads 11. The ball pads 23 are formed at the ends of the metal wiring layer 21 for formation of the solder balls 28.

Another dielectric layer 24 (hereinafter referred to as a second dielectric layer) is formed to a predetermined thickness on the entire surface of the silicon substrate 12 except for the ball pads 23. The second dielectric layer 24 covers the passivation layer 13, the metal wiring layer 21, and the first dielectric layer 22.

After the solder ball 28 is placed on a ball pad 23, the solder ball 28 is fixed or connected to the ball pad 23 through a solder reflow process using heat.

The conventional CSP 20 has several disadvantages. For example, the size of the solder ball 28 is small and the ball pad 23 is exposed only through a connection hole 27 formed in the second dielectric layer 24. Thus, the contact area between the ball pad 23 and the solder ball 28 is relatively small. The narrower the pitch between two adjacent ball pads 23 is, the smaller the contact area between the ball pad 23 and the solder ball 28 must be. Therefore, the connection reliability of the solder ball 28 to the ball pad 23 is reduced together with the reduction of the pitch between the ball pads 23. In addition, the ball pad 23 is formed in a circular shape and is enclosed by the second dielectric layer 24. Thus, even though the solder ball 28 is not metallically connected with the second dielectric layer 24, it is in contact with it. This plus the fact that the connection of the solder ball 28 is made only to the flat surface of the ball pad 23 may reduce the connection reliability of the solder ball 28 to the ball pad 23.

SUMMARY OF THE INVENTION

An integrated circuit (IC) is created on or in a semiconductor substrate such as silicon substrate by a wafer fabrication process. The IC is electrically connected to a plurality of chip pads. A passivation layer is formed on an upper surface of the substrate for protection of the chip pads and the IC. A semiconductor chip contains both the IC and the chip pads. A semiconductor wafer includes these semiconductor chips and scribe lines. The scribe lines are used to divide the semiconductor chips. A first dielectric layer is formed on the passivation layer, leaving a portion of each chip pad exposed. A second dielectric layer is formed on the first dielectric layer to expose the chip pad. The second dielectric layer has an embossed portion such that a portion of the first dielectric layer where a ball pad is to be formed is exposed. A metal wiring layer is formed on the second dielectric layer and the embossed portion for the redistribution of the chip pad. The metal wiring layer is also connected to the chip pad. A third dielectric layer is then formed on the metal wiring layer and the second dielectric layer for protection of the metal wiring layer. A ball pad is formed by removing a portion of the third dielectric layer located on the embossed portion. A solder ball is placed on the ball pad including the embossed portion of the second dielectric layer. The semiconductor wafer is cut along the scribe lines to obtain wafer level chip scale packages.

The embossed portion may be formed such that the ring shape of the second dielectric layer remains on the exposed circular shape of the first dielectric layer. The embossed portion may include a concave portion of the first dielectric layer and a convex portion of the second dielectric layer. The convex portion may have a discontinuous ring shape. The diameter of the convex portion may be smaller than that of the concave portion. The area of the convex portion may be approximately equal to that of the concave portion inside the convex portion. The first dielectric layer may be formed such that the passivation layer inside the ring-shaped second dielectric layer is exposed.

The second dielectric layer may be formed such that the passivation layer inside the ring-shaped second dielectric layer is exposed.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which:

FIG. 3 is a simplified plan view of a semiconductor wafer;

FIG. 4 is an enlarged plan view of a portion of a semiconductor device;

FIG. 5 is an enlarged cross-sectional view of the same portion of semiconductor device;

FIG. 6 is a cross-sectional view illustrating the coating of a first dielectric layer;

FIG. 7 is a cross-sectional view illustrating the patterning of the first dielectric layer to expose a chip pad;

FIG. 8 is a plan view illustrating the patterning of a second dielectric layer to expose the chip pad and to form an embossed portion corresponding to a ball pad to be formed later;

FIG. 9 is a cross-sectional view taken along the line 9—9 in FIG. 8, illustrating the patterning of the second dielectric layer to expose the chip pad and to form the embossed portion corresponding to a ball pad to be formed later;

FIG. 10 is a cross-sectional view illustrating the formation of a metal wiring layer to connect the chip pad to the embossed portion;

FIG. 11 is a cross-sectional view illustrating the coating of a third dielectric layer;

FIG. 12 is a plan view illustrating the patterning of the third dielectric layer to expose the embossed portion and consequently to form the ball pad;

FIG. 13 is a cross-sectional view taken along the line 13—13 in FIG. 12, illustrating the patterning of the third dielectric layer to expose the embossed portion and consequently to form the ball pad;

FIG. 14 is a cross-sectional view illustrating a solder ball formed on the ball pad;

FIG. 16 is a cross-sectional view illustrating the patterning of a first dielectric layer to expose a chip pad and to form a first concave portion at the center of an area to be formed as a ball pad;

FIG. 17 is a plan view illustrating the patterning of a second dielectric layer to expose the chip pad and the first concave portion and to form a second concave portion outside the first concave portion;

FIG. 18 is a cross-sectional view taken along the line 18—18 in FIG. 17, illustrating the patterning of the second dielectric layer to expose the first concave portion and to form the second concave portion outside the first concave portion;

FIG. 19 is a plan view illustrating the patterning of a third dielectric layer to expose the embossed portion including the first and second concave portions and consequently to form the ball pad;

FIG. 20 is a cross-sectional view taken along the line 20—20 in FIG. 19, illustrating the patterning of the third dielectric layer to expose the embossed portion including the first and second concave portions and consequently to form the ball pad; and FIG. 21 is a cross-sectional view of the solder ball formed on the ball pad.

DETAILED DESCRIPTION OF THE INVENTION

Embodiments of the present invention will be described below with reference to the accompanying drawings.

Figure 1:
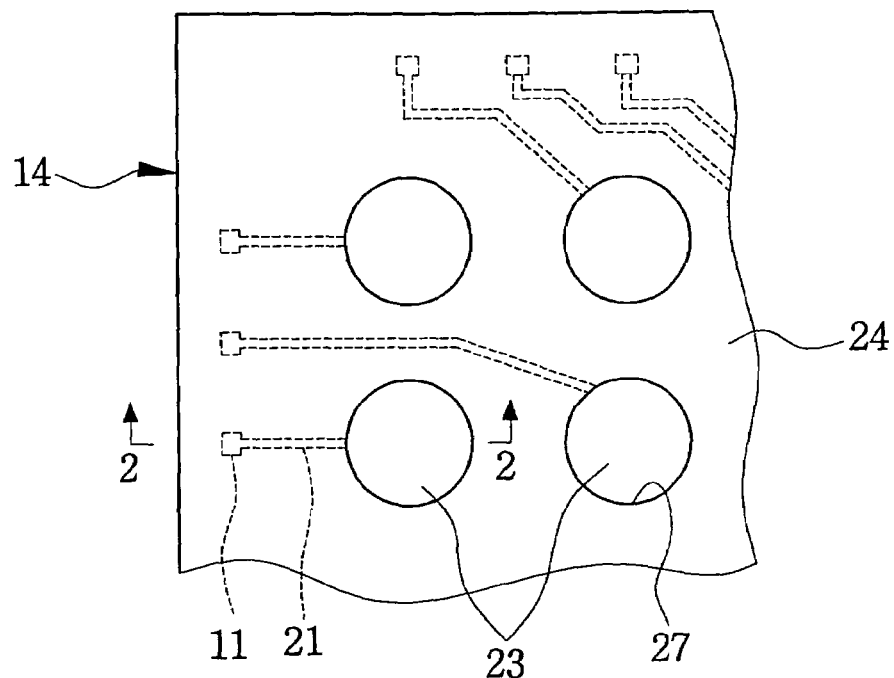
FIG. 1 is a plan view of a conventional wafer level chip scale package.
Figure 2:
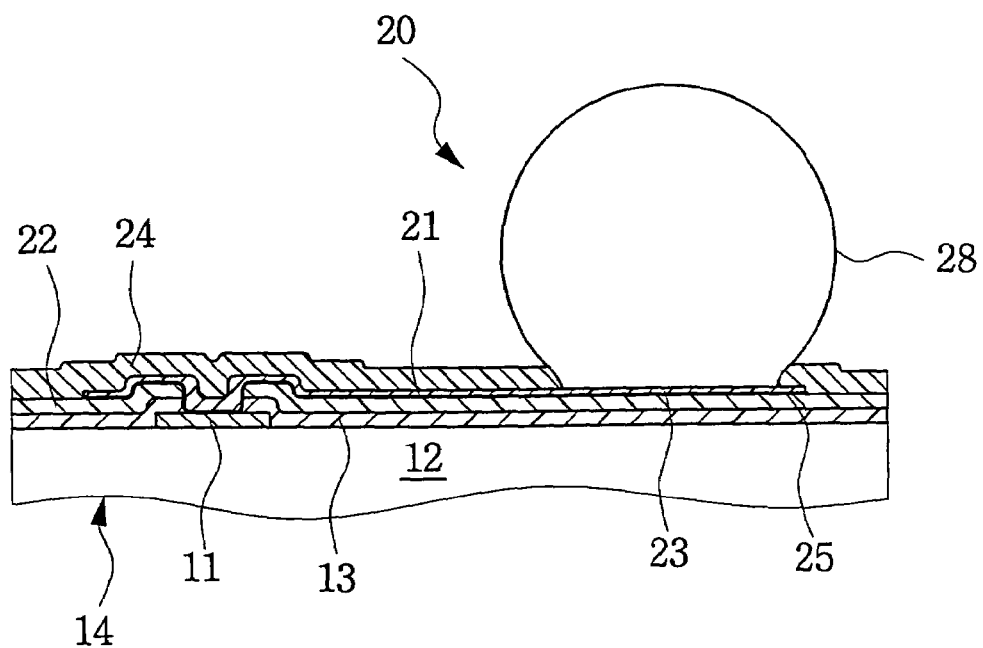
FIG. 2 is a cross-sectional view taken along the line 2—2 in FIG. 1.
Figure 3:
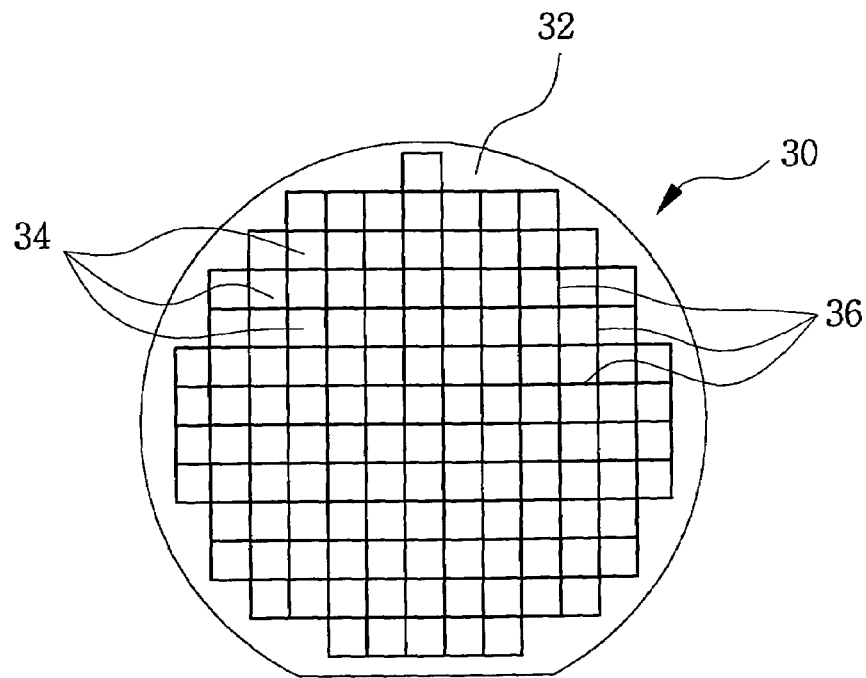
FIGS. 3 through 14 are views illustrating each step of a method for manufacturing a wafer level chip scale package in accordance with an embodiment of the present invention.

FIGS. 3 through 14 are views illustrating a method for manufacturing a wafer level chip scale package 70 in accordance with an embodiment of the present invention. FIG. 3 is a simplified plan view of a semiconductor wafer 30.

Referring to FIG. 3, an integrated circuit (IC) (not illustrated for simplicity) is formed on a semiconductor substrate such as a silicon substrate 32 using a wafer fabrication process. A wafer 30 has a plurality of semiconductor chips 34 and scribe lines 36 therebetween. The semiconductor chips 34 are divided along the scribe lines 36.

Figure 4:
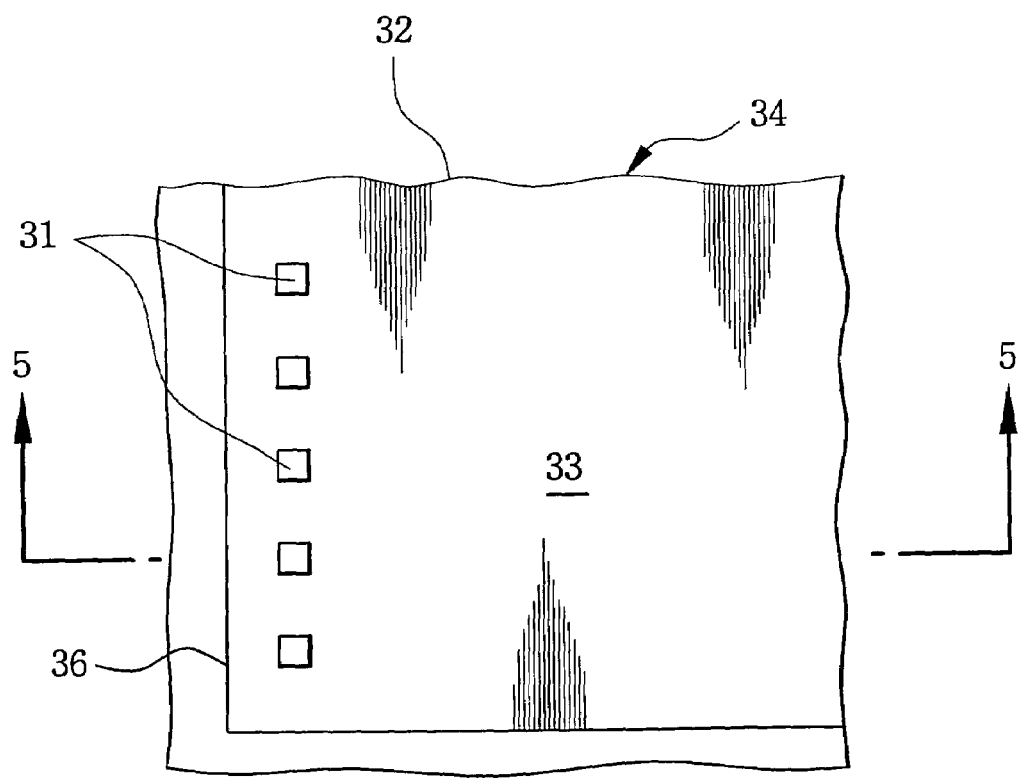

FIG. 4 illustrates schematically a semiconductor chip 34. FIGS. 5 through 14 illustrate a portion of the semiconductor chip 34.

Figure 5:
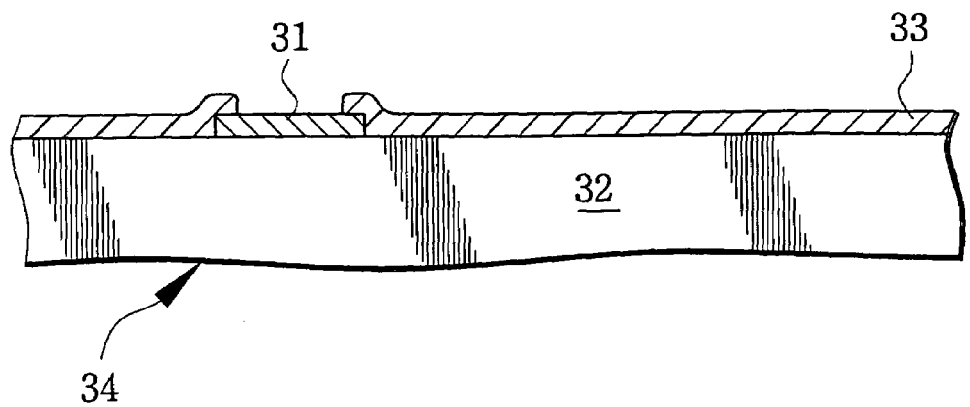

Referring to FIGS. 4 and 5, the semiconductor chip 34 comprises a plurality of chip pads 31 formed on an upper surface of the silicon substrate 32. The chip pads 31 are electrically connected to the IC. A passivation layer 33 covers the upper surface of the silicon substrate 32 and surrounds the chip pads 31 to protect the IC protected from external environments. The chip pads 31 are made of Al and the passivation layer 33 is made of oxide or nitride. Although the chip pads 31 are disposed along the periphery of the semiconductor chip 34 as shown in FIG. 4, the position of the chip pads 31 may not be limited to the periphery of the semiconductor chip 34. For example, the chip pads 32 may be formed on a central portion of the semiconductor chip 34.

Figure 6:
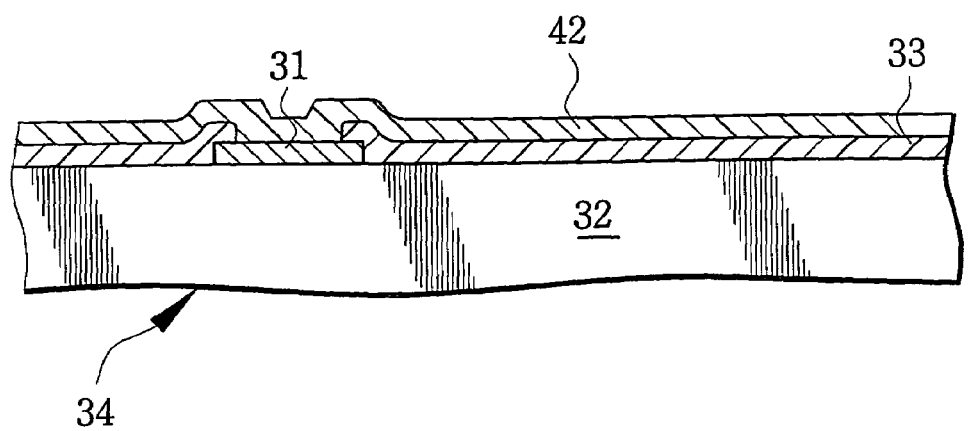
Figure 7:
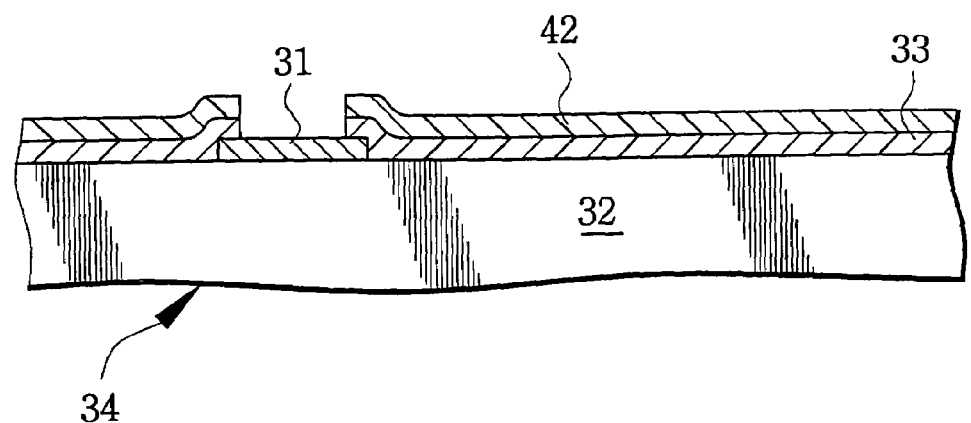

Referring to FIGS. 6 and 7, a first dielectric layer 42 is formed on the passivation layer 33. The first dielectric layer 42 serves as a lower dielectric layer for formation of a metal wiring layer on the passivation layer 33. The first dielectric layer 42 is formed to a predetermined thickness on the passivation layer 33, leaving a portion of the chip pads 31 exposed. The first dielectric layer 42 may be made of organic materials which are stress-absorbing, such as polyimide or benzo cyclo butene (BCB). The chip pads 31, as shown in FIG. 7, are exposed through the first dielectric layer 42 using conventional photolithography and etching techniques.

Figure 8:
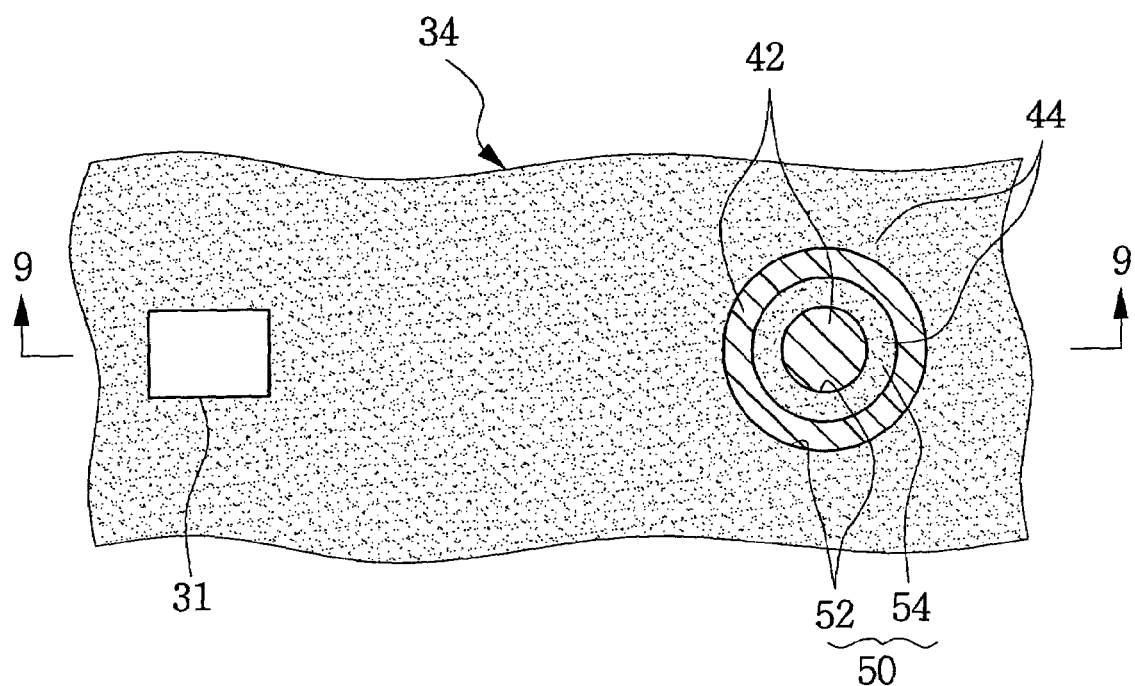
Figure 9:
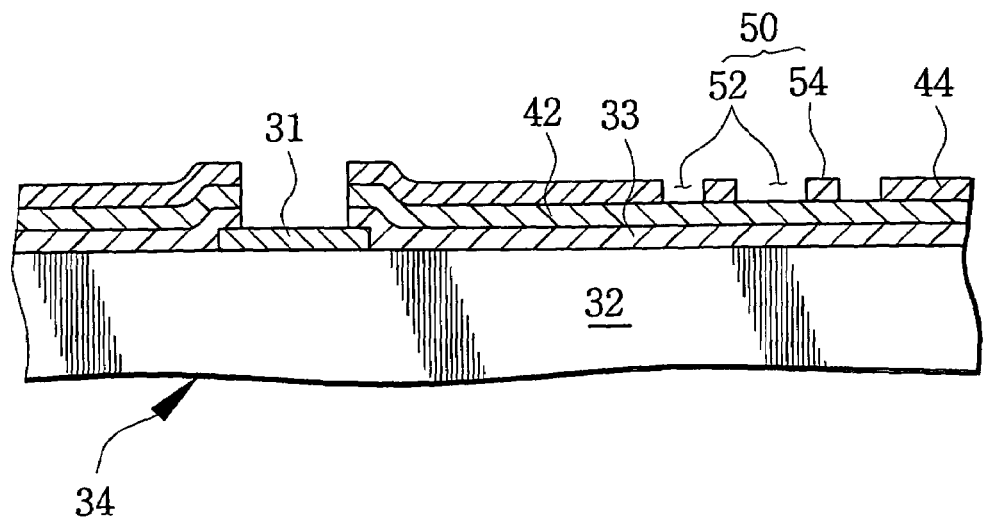

Referring to FIGS. 8 and 9, a second dielectric layer 44 is formed on the first dielectric layer 42 to a predetermined thickness, leaving a portion of the chip pads 31 exposed. The second dielectric layer 44 is patterned such that a portion of the first dielectric layer 42 where a ball pad is to be formed (a ball pad area) is exposed. At this time, the second dielectric layer 44 located within the ball pad area is not completely removed. Rather, a portion of the second dielectric layer 44 remains within the ball pad area, for improved connection reliability between the solder ball and the ball pad. The exposed portion of the first dielectric layer 42 is hereinafter referred to as a concave portion 52. The second dielectric layer 44 remaining on the ball pad area is hereinafter referred to as a convex portion 54. An embossed portion 50 comprises the concave portion 52 and the convex portion 54. If the ball pad is to be circular, the concave portion 52 is circular and the convex portion 54 is ring-shaped. The embossed portion 50 may increase the contact area with the metal wiring layer, thus improving the connection reliability between the solder ball and the ball pad.

Conventional photolithography and etching techniques are used to expose the chip pads 31 through the second dielectric layer 44 and to embossed portion 50. The second dielectric layer 44 may also be made of a material including, but not limited to, polyimide or BCB.

Figure 10:
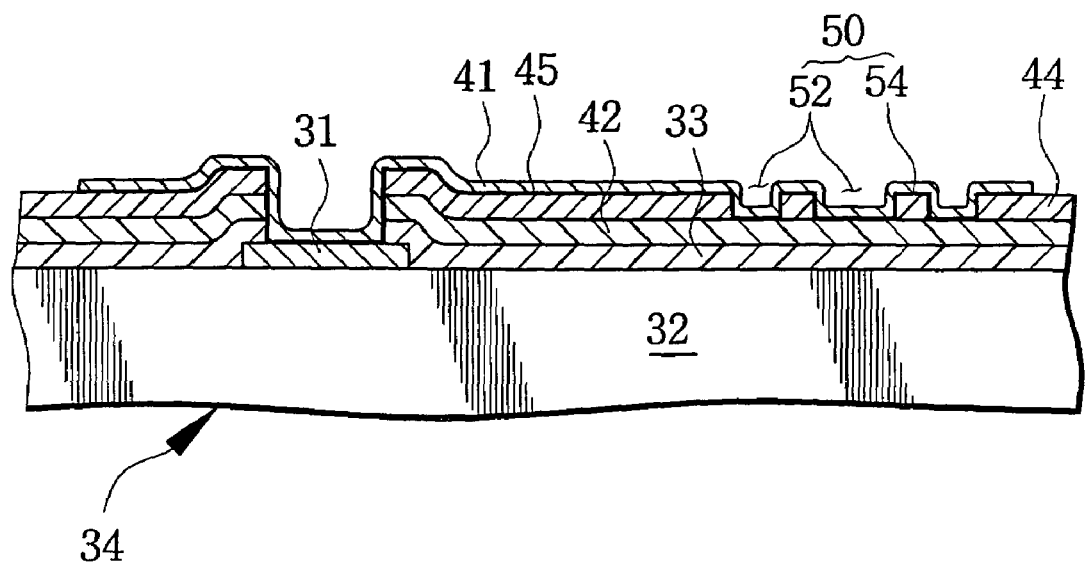

Referring to FIG. 10, the metal wiring layer 41 is formed for redistribution of each chip pad 31. The metal wiring layer 41 is formed on the chip pad 31, the second dielectric layer 44, and the embossed portion 50 to connect the chip pad 31 to the embossed portion 50. The metal wiring layer 41 may be formed by conventional techniques such as sputtering or chemical vapor deposition methods. The metal wiring layer 41 may be a single layer of Cu or Al, or multi-layered structure of several metals.

Before the formation of the metal wiring layer 41, a metal base layer 45 may be formed where the metal wiring layer 41 is to be formed. The metal base layer 45 may serve as an adhesive, a diffusion barrier, or a plating base layer for the metal wiring layer 41. The metal base layer 45 may be Ti/Cu, Ti/Ti—Cu/Cu, Cr/Cr—Cu/Cu, TiW/Cu, Al/Ni/Cu, or Al/NiV/Cu.

Figure 11:
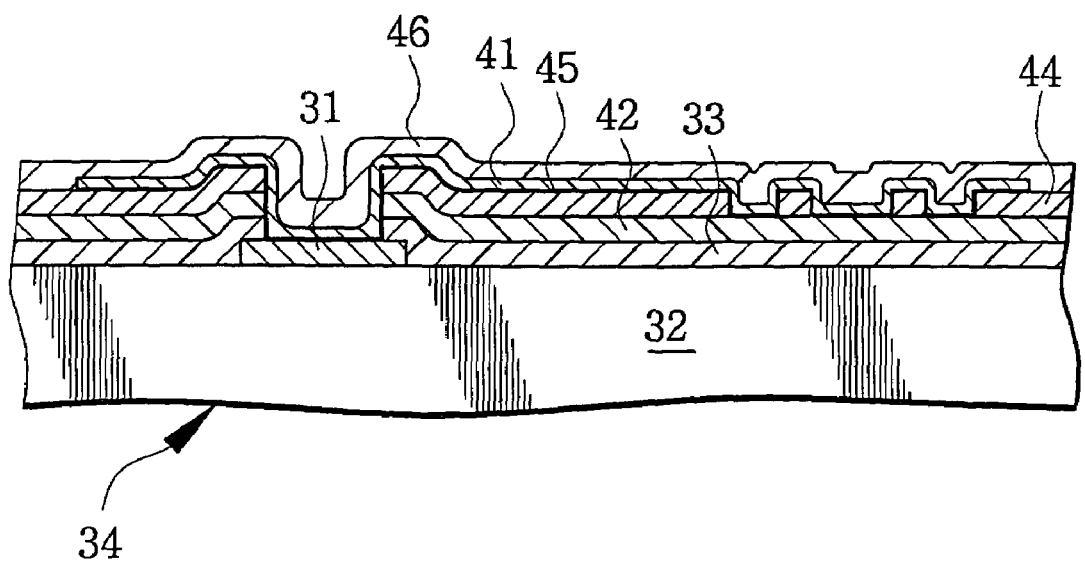

Referring to FIG. 11, a third dielectric layer 46 is formed to a predetermined thickness on the resulting structure. The third dielectric layer 46 covers the passivation layer 33, the metal wiring layer 41, the first dielectric layer 42, and the second dielectric layer 44. The third dielectric layer 46 protects the semiconductor chip 34 by absorbing shocks that may be applied thereto. The third dielectric layer 46 also may serve as a wiring substrate. The third dielectric layer 46 may be made of, for example, polyimide or BCB.

Figure 12:
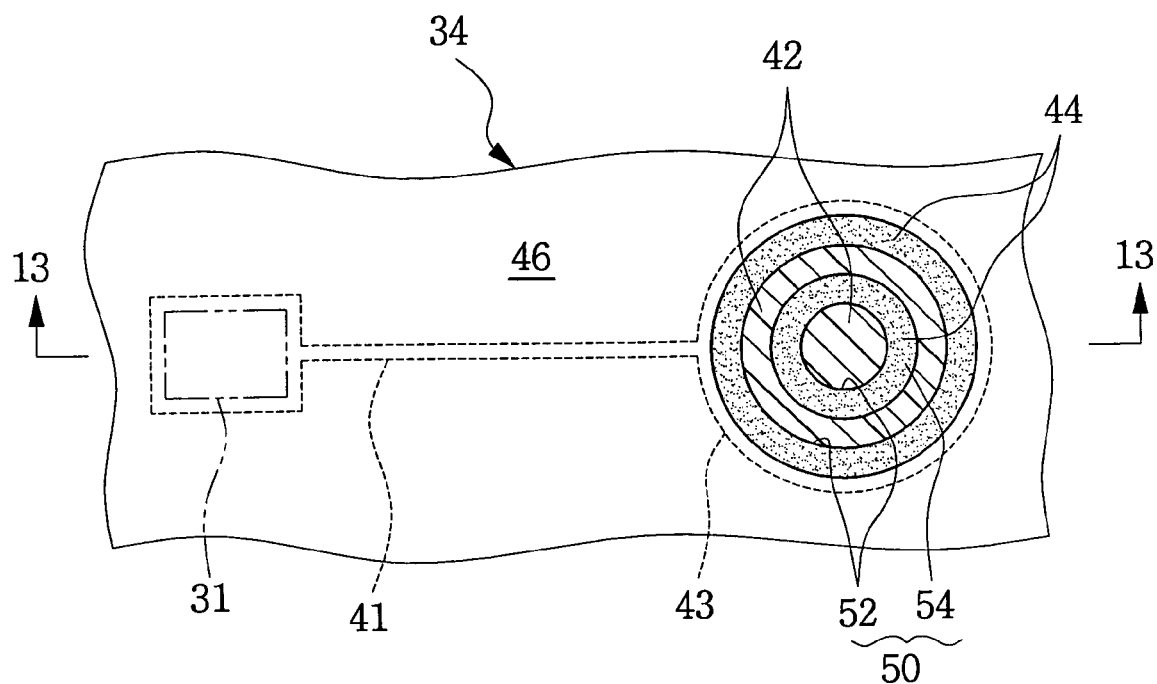
Figure 13:
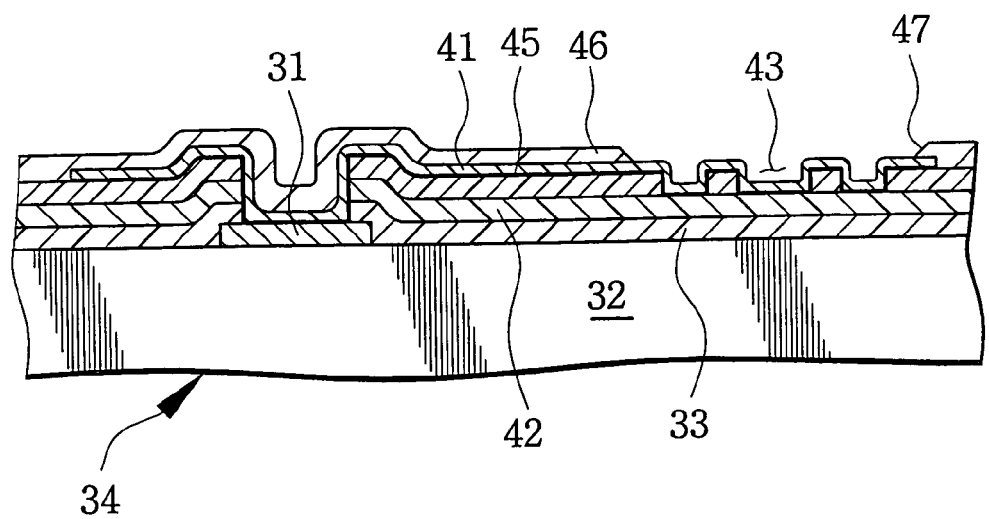

Referring to FIGS. 12 and 13, a portion of the third dielectric layer 46 located on the embossed portion 50 is removed to form a connection hole 47 that expose a ball pad 43. Because the ball pad 43 is electrically connected (redistributed) to the chip pad 31 through the metal wiring layer 41, the exact positions of the ball pad 43 and the chip pad 31 may not be limited.

The area of the convex portion 54 may be approximately equal to the area of the concave portion 52 inside the convex portion 54, for improved connection reliability between the solder ball 60 and the ball pad 43.

Figure 14:
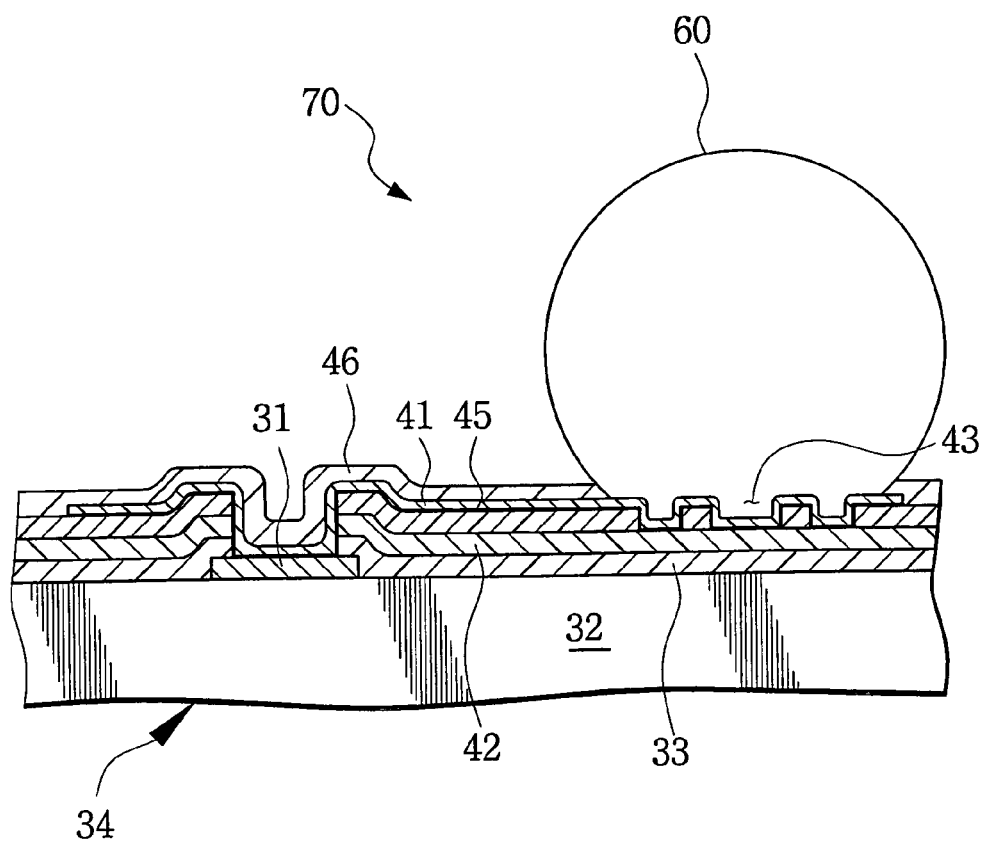

Referring to FIG. 14, a solder ball 60 is formed on the ball pad 43. The ball pad 43 is coated with flux. The solder ball 60 is placed on the ball pad 43 and is reflowed. The solder ball 60 is thus electrically connected to the metal wiring layer 41 and the chip pad 31 through the ball pad 43. Because the ball pad 43 contacts the solder ball 60 with the embossed portion, i.e., an uneven contact surface, the contact area between the solder ball 60 and the ball pad 43 may increase, thereby improving the connection reliability between the solder ball 60 and the ball pad 43.

Although the present invention described above employs the ball placement method, the solder ball 60 may be formed by other methods such as plating, stencil printing, or metal jet methods.

After the package is manufactured at wafer level as described above, the packages are divided along the scribe lines (36 of FIG. 3) to obtain the wafer level chip scale package 70.

Figure 15:
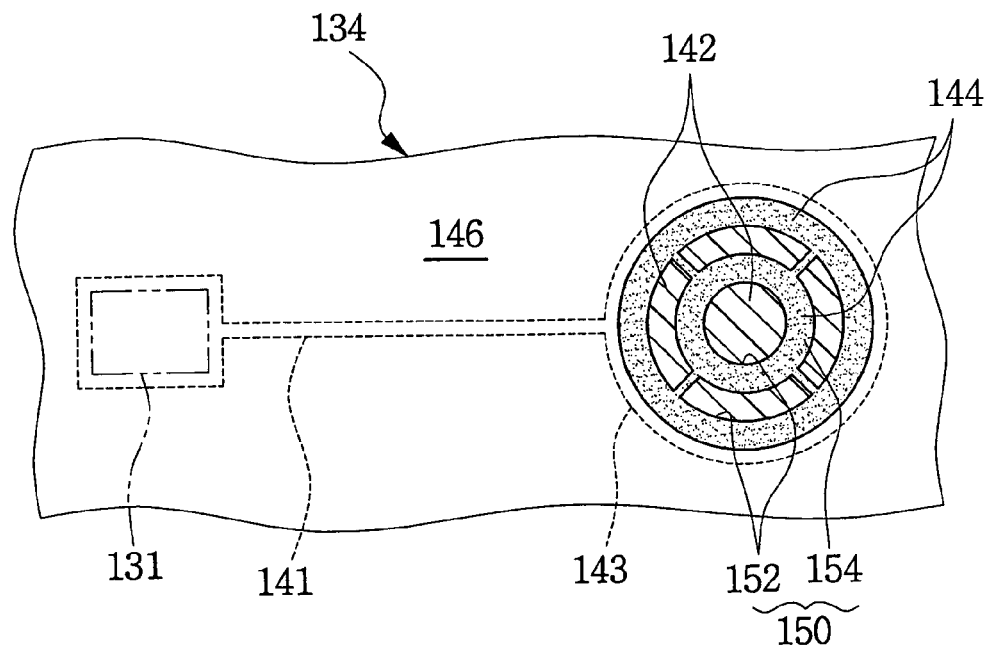
FIG. 15 is a plan view of a method for manufacturing a wafer level chip scale package in accordance with another embodiment of the present invention, illustrating another example of the embossed portion.

Although the previously described embodiment shows the convex portion 54 as a continuous ring-shape, the convex portion 54 may have a discontinuous ring-shape, as shown in FIG. 15.

FIGS. 16 through 21 are views illustrating a method for manufacturing a wafer level chip scale package 270 in accordance with another embodiment of the present invention.

Figure 16:
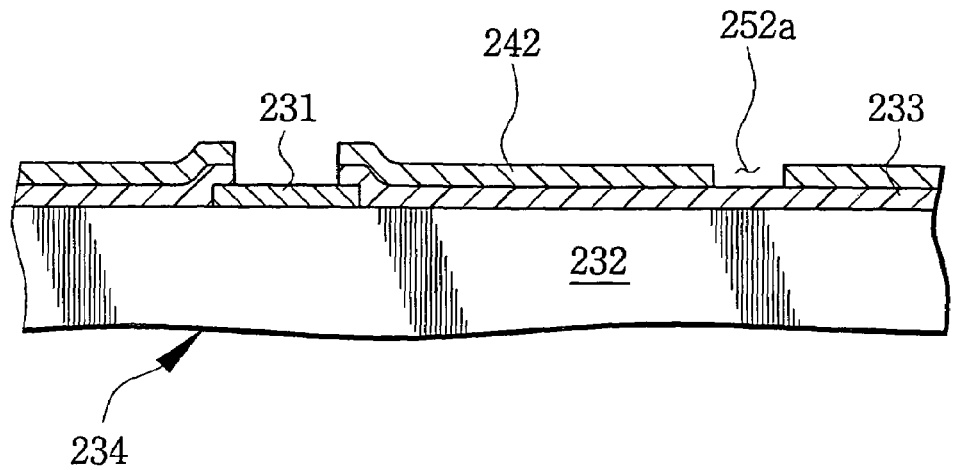
FIGS. 16 through 21 are views illustrating each step of a method for manufacturing a wafer level chip scale package in accordance with yet another embodiment of the present invention.

Referring to FIG. 16, a first dielectric layer 242 is formed on a passivation layer 233. The first dielectric layer 242 serves as a lower dielectric layer for formation of a metal wiring layer on the passivation layer 233. The first dielectric layer 242 is formed to a predetermined thickness on the passivation layer 233, leaving the chip pads 231 exposed. The first dielectric layer 242 has a first concave portion 252a such that a portion of the passivation layer 233 where a ball pad is to be formed (a ball pad area) is exposed. The first concave portion 252a may be smaller in size than the ball pad to be formed later and may be formed corresponding to the center of the ball pad.

Figure 17:
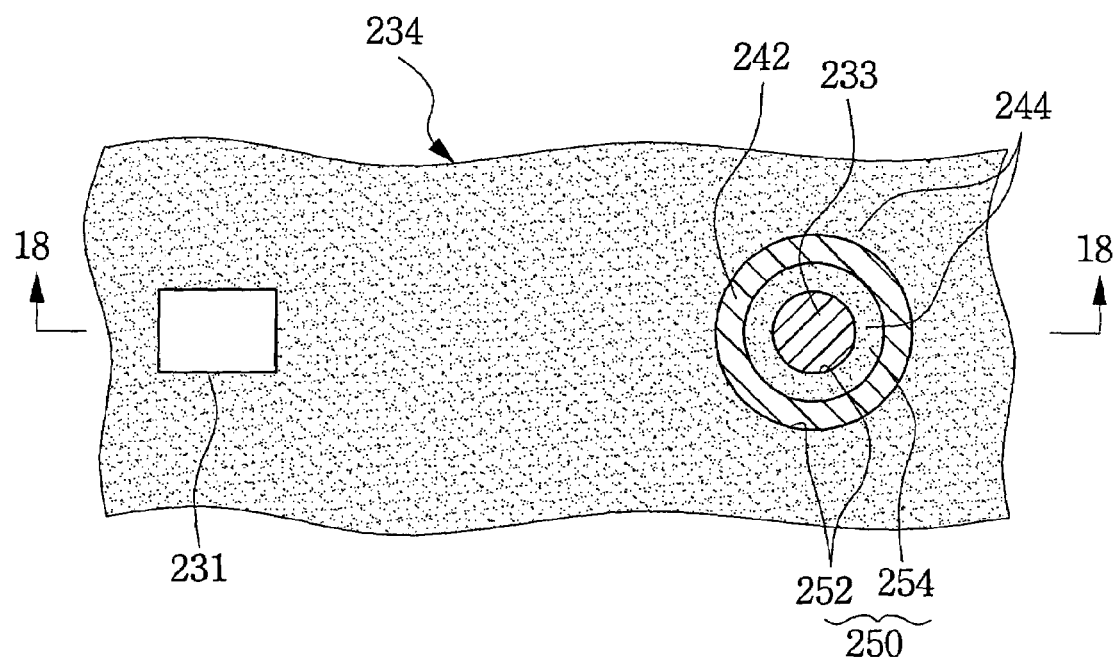
Figure 18:
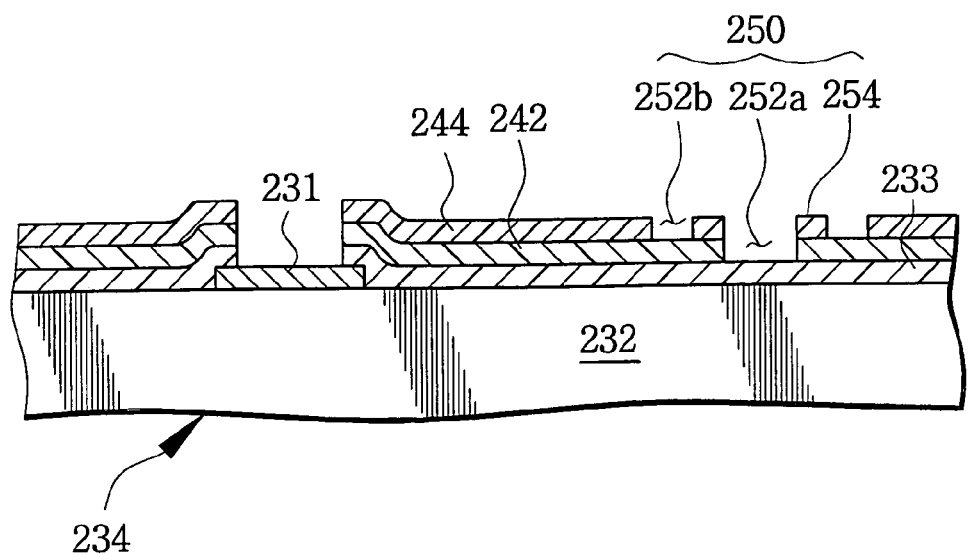

Referring to FIGS. 17 and 18, a second dielectric layer 244 is formed on the first dielectric layer 242 to a predetermined thickness, leaving chip pads 231 exposed. The second dielectric layer 244 is patterned such that a portion of the first dielectric layer 242, where a ball pad is to be formed (the ball pad area), is exposed. At this time, the second dielectric layer 244 located within the ball pad area is not completely removed. Rather, a portion of the second dielectric layer 244 (a convex portion 254) remains within the ball pad area, for improved connection reliability between the solder ball and the ball pad. The exposed portion of the passivation layer 233 inside the convex portion 254 is a first concave portion 252a. The exposed portion of the first dielectric layer 242 outside the convex portion 254 is a second concave portion 252b. The embossed portion 250 comprises the first and second concave portions 252a and 252b and the convex portion 254. If the ball pad is to be circular, the first and second concave portions 252a and 252b are circular and the convex portion 254 is ring-shaped. The embossed portion 250 may increase the contact area with the metal wiring layer and improve the connection reliability between the solder ball and the ball pad.

Because the formation of the metal wiring layer 241 and the metal base layer 245 in this embodiment are the same as that of the first embodiment, the description thereof is herein omitted.

Figure 19:
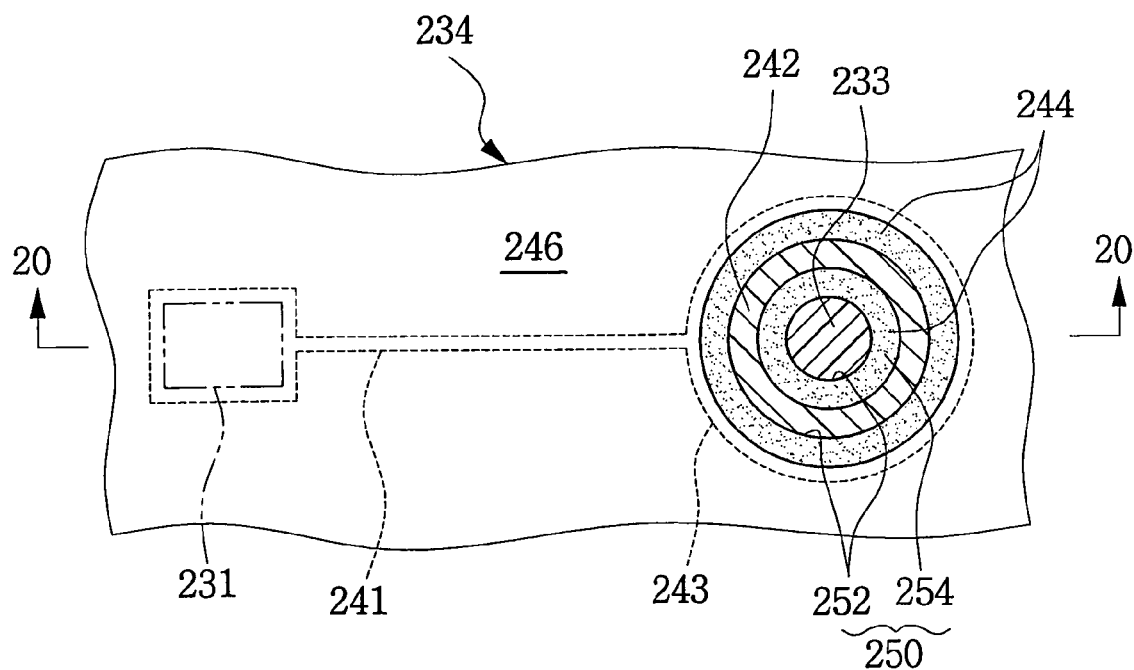
Figure 20:
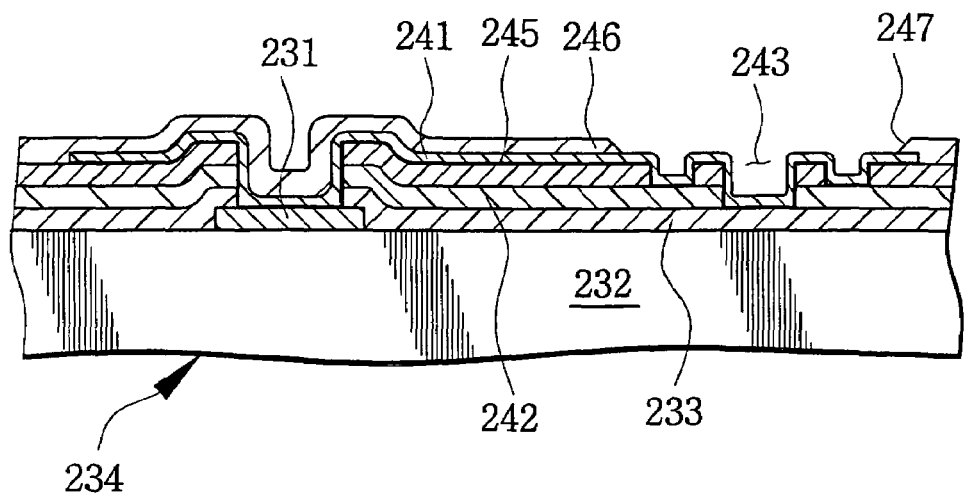

Referring to FIGS. 19 and 20, a third dielectric layer 246 is formed on the resulting structure to a predetermined thickness. The third dielectric layer 246 located on the embossed portion 250 is removed to form a connection hole 247 that exposes a ball pad 243 and the metal wiring layer 241.

Figure 21:
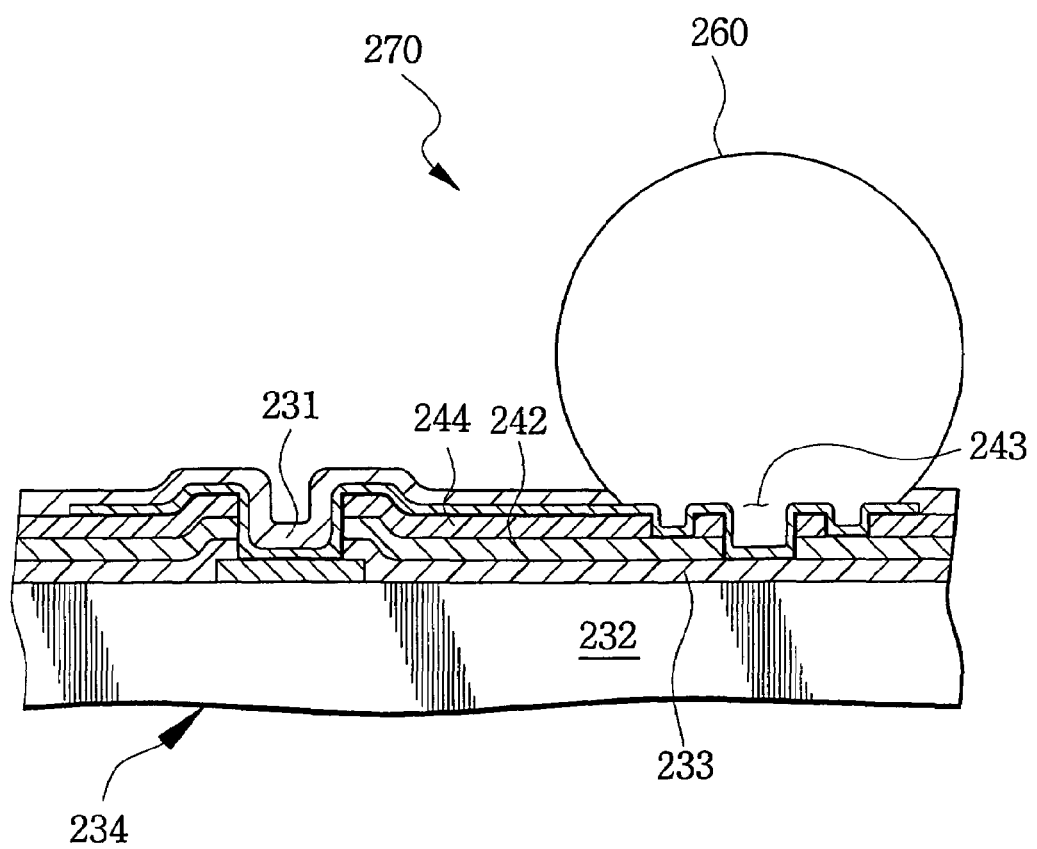

Although this embodiment shows a continuous ring-shaped convex portion 254 between the first concave portion 252a and the second concave portion 252b, the convex portion 254 may be discontinuously formed as shown in FIG. 15. Referring to FIG. 21, a solder ball 260 is formed on the ball pad 243.

After the package manufacture is completed through the above described embodiments, the wafer is divided along the scribe lines to obtain a wafer level chip scale package 270.

In the embodiment described in FIG. 12, only the first dielectric layer 42 is exposed through the concave portions 52 of the embossed portion 50. However, in the embodiment described right above, both the passivation layer 233 and the first dielectric layer 242 are exposed through the first concave portion 252a and second concave portion 252b, respectively.

The ball pad may be selected according to the thicknesses and material properties of the first and second dielectric layers 242, 244. For example, if the second dielectric layer 244 has a thickness of 15 μm or greater, the ball pad of the embodiment right above (FIG. 18) is preferable. If the second dielectric layer has a thickness of less than 15μm, the ball pad shown in FIG. 11 is preferred.

In accordance with the present invention, an embossed portion is formed inside the ball pad and the metal wiring layer is formed on the embossed portion. Thus, the contact area between the solder ball and the metal wiring layer can be significantly increased, thereby improving the connection reliability between the ball pad and the solder ball.

Although the exemplary embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A method for a wafer level chip scale package (CSP), the method comprising:
   providing a semiconductor wafer, the semiconductor wafer including semiconductor chips having chip pads and a passivation layer, the wafer further including scribe lines between the chips;
   forming a first patterned dielectric layer on the passivation layer that exposes the chip pads;
   forming a second patterned dielectric layer on the first patterned dielectric layer that exposes the chip pads;
   forming an embossed region on the first patterned dielectric layer, the second patterned dielectric layer, and the passivation layer including a concave portion that exposes a portion of the passivation layer where a ball pad is to be formed and a convex portion that is formed from the second patterned dielectric layer;
   forming a metal wiring layer on the embossed region directly on the exposed portion of the first patterned dielectric layer, the exposed portion of the second patterned dielectric layer, and the exposed portion of the passivation layer, the metal wiring layer being electrically connected to the chip pads;
   forming a third dielectric layer on the metal wiring layer; and
   removing a portion of the third dielectric layer over the embossed region to form a connection hole therein, the connection hole exposing a portion of the metal wiring layer to form the ball pad.

2. The method of claim 1, wherein the concave portion comprises a substantially cylindrical shape and the convex portion has an annular shape.

3. The method of claim 1, wherein the convex portion comprises a single discontinuous ring shape.

4. The method of claim 1, wherein an area of the concave portion is inside the convex portion.

5. The method of claim 1, further comprising:
   forming a solder ball on the ball pad; and
   cutting the semiconductor wafer along the scribe lines.

6. The method of claim 2, wherein forming a second patterned dielectric layer comprises exposing a portion of the first patterned dielectric layer inside the annular convex portion.

7. A method for a wafer level chip scale package (CSP) comprising:
   providing a semiconductor wafer, the semiconductor wafer including semiconductor chips each having chip pads and a passivation layer;
   forming a first dielectric layer on the passivation layer;
   patterning the first dielectric layer to expose the chip pads;
   forming a second dielectric layer on the patterned first dielectric layer;
   patterning the second dielectric layer to expose the chip pads;
   forming an embossed region on the first patterned dielectric layer, the second patterned dielectric layer, and the passivation layer;
   forming a concave portion in the embossed region that includes an exposed portion of the passivation layer where a ball pad is to be formed;
   forming a convex portion in the embossed region;
   forming a metal wiring layer on the embossed region directly on the exposed portion of the first patterned dielectric layer, the exposed portion of the second patterned dielectric layer, and the exposed portion of the passivation layer, the metal wiring layer being electrically connected to the chip pads;
   forming a third dielectric layer on the metal wiring layer; and
   removing a portion of the third dielectric layer to form a connection hole therein, the connection hole exposing a portion of the metal wiring layer over the embossed region to form a ball pad.

8. The method of claim 7, further comprising:
   forming a solder ball on the ball.

9. A method of making a wafer level chip scale package (CSP), the method comprising:
   providing a semiconductor wafer, the semiconductor wafer including a semiconductor chip having chip pads and a passivation layer, the wafer further including scribe lines between the chips;

forming a first patterned dielectric layer on the passivation layer that exposes the chip pads;

forming a second patterned dielectric layer on the first patterned dielectric layer that exposes the chip pads, wherein the first patterned dielectric layer, the second patterned dielectric layer, and the passivation layer have an embossed region comprising a substantially cylindrical concave portion and an annular convex portion, the concave portion exposing a portion of the passivation layer where a ball pad is to be formed, the convex portion being formed of the second dielectric layer;

forming a metal wiring layer on the embossed region directly on the exposed portion of the first patterned dielectric layer, the exposed portion of the second patterned dielectric layer, and the exposed portion of the passivation layer, the metal wiring layer being electrically connected to the chip pads;

forming a third dielectric layer on the metal wiring layer; and removing a portion of the third dielectric layer to form a connection hole that exposes a portion of the metal wiring layer.

10. The method of claim 2 wherein the convex portion is contained within the concave portion.

11. The method of claim 10 wherein the convex portion is bounded by substantially vertical side walls and wherein said method further includes forming a ball pad on the concave portion, the convex portion, and the walls.

12. The method of claim 4 wherein the area of the concave portion inside the convex portion is approximately equal to an area of the convex portion.

* * * * *